United States Patent
Mori et al.

(10) Patent No.: US 6,750,720 B1
(45) Date of Patent: Jun. 15, 2004

(54) HIGH-FREQUENCY AMPLIFIER

(75) Inventors: Kazutomi Mori, Tokyo (JP); Shintarou Shinjo, Tokyo (JP); Hiroyuki Joba, Tokyo (JP); Yoshinori Takahashi, Tokyo (JP); Yukio Ikeda, Tokyo (JP); Tadashi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/149,390
(22) PCT Filed: Oct. 12, 2000
(86) PCT No.: PCT/JP00/07085
§ 371 (c)(1), (2), (4) Date: Jun. 12, 2002
(87) PCT Pub. No.: WO02/31968
PCT Pub. Date: Apr. 18, 2002
(51) Int. Cl.[7] .................................................. H03F 3/04
(52) U.S. Cl. ........................................ 330/288; 330/296
(58) Field of Search ............................... 330/285, 288, 330/296

(56) References Cited

U.S. PATENT DOCUMENTS 6,417,734 B1 * 7/2002 Luo et al. ................... 330/296
6,486,739 B1 * 11/2002 Luo ........................... 330/288

FOREIGN PATENT DOCUMENTS

| GB | 2343762 A | 5/2000 |
| JP | 10-303655 A | 11/1998 |
| JP | 11-68473 A | 3/1999 |
| JP | 2000-148269 A | 5/2000 |

OTHER PUBLICATIONS

Aoki, Chapter 3, Current Mirror Circuit, 3.2 Current Compensation Current Mirror Circuit (2) (1992) w/ English Translation pp. 74–75.

* cited by examiner

Primary Examiner—Steven J. Mottola
(74) Attorney, Agent, or Firm—Birch, Stewart, Kolasch & Birch, LLP

(57) ABSTRACT

Between resistors 13, 14 and an NPN bipolar transistor 12 are interposed PNP bipolar transistors 21, 22 forming a current mirror 20 that uses a collector current of the NPN bipolar transistor 12 as a reference current, and determines a collector current of an NPN bipolar transistor 11. This makes possible to design a size ratio A of the PNP bipolar transistors 21, 22 so as to approximate a voltage drop $\Delta Vb$ to a value close to zero, and to suppress the voltage drop $\Delta Vb$ of the base voltage Vb accordingly to achieve a high power output and high efficiency when a high frequency input signal Pin increases and generates a base rectified current.

2 Claims, 3 Drawing Sheets

HIGH-FREQUENCY AMPLIFIER

This application is the national phase under 35 U.S.C. § 371 of PCT International Application No. PCT/JP00/07085 which has an International filing date of Oct. 12, 2000, which designated the United States of America.

TECHNICAL FIELD

The present invention relates to a high frequency amplifying device for use in a satellite communication, ground microwave communication, mobile communication, and the like.

BACKGROUND ART

Generally, a high frequency amplifier using an NPN bipolar transistor of the BJT, HBT, or the like takes on a constant voltage biasing circuit that applies a constant voltage to the base in order to achieve a high power output and high efficiency. When a constant bias current is applied to the base, and when power of a high frequency input signal increases and generates a rectified current, the base voltage drops in order to maintain the constant current. Accordingly, when the power of input signal increases, since the amplifier operation rapidly approaches to the B-class, the saturation power decreases, and the high power output and high efficiency cannot be achieved. When a constant bias voltage is applied to the base, on the other hand, since the base voltage will not drop, the biasing class does not change, and a greater saturation power output and higher efficiency can be attained in comparison to the case of the constant current biasing. Therefore, a constant voltage biasing circuit that does not lower the base voltage, becomes necessary even when there is an increase of the base current with an increase of the power of input signal.

FIG. 1 is a circuit diagram illustrating a high frequency amplifying device, in that a base current compensating current mirror circuit is used for the constant voltage biasing circuit, which is presented, for example, in "Introduction To Functional Circuit Design of Analog ICs, IC Designing Method Using Circuit Simulator SPICE" (written by Hidehiko Aoki, issued by the CQ publisher, Sep. 20, 1992, page 74).

In the drawing, reference numeral 1 signifies a high frequency amplifier using an NPN bipolar transistor such as the BJT, HBT, or the like, as the amplifying element, and 2 signifies a constant voltage biasing circuit that supplies a base bias voltage to the high frequency amplifier 1.

In the high frequency amplifier 1, reference numeral 3 signifies an NPN bipolar transistor such as the BJT, HBT, or the like, 4 signifies the ground connected to the emitter terminal of the NPN bipolar transistor 3, 5 signifies a high frequency signal in,put terminal, 6 signifies a high frequency signal output terminal, 7 signifies a base bias terminal, 8 signifies a collector bias terminal.

In the constant voltage biasing circuit 2, reference numeral 11 signifies an NPN bipolar transistor such as the BJT, HBT, or the like, which configures a current mirror circuit together with the NPN bipolar transistor 3 of the high frequency amplifier 1, whose base terminal is connected to the base bias terminal 7, whose emitter terminal is connected to the ground 4. Reference numeral 12 signifies an NPN bipolar transistor such as the BJT, HBT, or the like, for a base current compensation, whose base terminal is connected to the collector terminal of the NPN bipolar transistor 11, whose emitter terminal is connected to the base terminal of the NPN bipolar transistor 11. Reference numeral 13 signifies a resistor connected between the collector terminal of the NPN bipolar transistor 12 and a power supply/voltage setting terminal 15, and 14 signifies a resistor connected between the base terminal of the NPN bipolar transistor 12 and the power supply/voltage setting terminal 15.

Next, the operation will be described.

A high frequency signal Pin is input to the high frequency amplifier 1 through the high frequency signal input terminal 5, and is output from the high frequency signal output terminal 6, after being amplified by the high frequency amplifier 1. A base voltage Vb and a base current Ibrf to the high frequency amplifier 1 are supplied from the constant voltage biasing circuit 2, and a collector current Icrf and a collector voltage Vc to the high frequency amplifier 1 are supplied from the collector bias terminal 8.

In the constant voltage biasing circuit 2, the base voltage Vb and the base current Ibrf are determined as follows. Here, it is supposed that a size of the NPN bipolar transistor 11 that forms the current mirror together with the high frequency amplifier, 1 is 1, a size of the NPN bipolar transistor 3 of the high frequency amplifier 1 is N, and a size of the NPN bipolar transistor 12 for the base current compensation is M. Also, it is supposed that these three NPN bipolar transistors 3, 11, 12 have the same structure and the same current amplification factor $\beta$. Further, the contact voltage Vref, the currents Iref, Icdc1, Ibdc1, Icdc2, Iedc2, Ibdc2, Ibrf, Icrf, and the resistor Rref are defined as shown in FIG. 1.

When a power supply voltage Vpc is supplied from the power supply/voltage setting terminal 15 of the constant voltage biasing circuit 2, the reference current Iref of the current mirror is given by the following expression.

$$Iref=(Vpc-2*Vb)/Rref$$

With regard to this reference current Iref, the collector current Icrf of the NPN bipolar transistor 3 of the high frequency amplifier 1 is given as follows.

$$Icrf = \frac{N}{1 + \frac{1+N}{\beta \cdot (1+\beta)}} Iref$$

Where the base bias voltage Vb of the NPN bipolar transistor 3 of the high frequency amplifier 1 is set as follows.

$$Vb=(Vpc-Iref*Rref)/2$$

The base current Ibrf flowing in this case becomes as follows.

$$Ibrf=Icrf/\beta$$

In this manner, the constant voltage biasing circuit 2 supplies the base voltage Vb and the base current Ib as the output thereof.

Since the conventional high frequency amplifying device is configured as above, when the high frequency input signal Pin increases and generates a base rectified current $\Delta Ib$, the base voltage Vb lowers by a voltage drop of $\Delta Vb$. Therefore, when the high frequency input signal Pin increases, the biasing class of the high frequency amplifier 1 approaches to the B-class, and the saturation output power and efficiency are decreased, which is a problem. Hereunder, the operation to cause the voltage drop $\Delta Vb$ will be explained.

In the conventional technique, a case will be examined, in which the input power of the high frequency amplifier 1 increases and generates the base rectified current of $\Delta Ib$, and consequently the constant voltage biasing circuit 2 increases the output of the base current Ibrf by ΔIb. When the base current Ibrf increases by ΔIb, assuming that the emitter current Iedc2 of the NPN bipolar transistor 12 for the base current compensation increases by ΔIedc2, and the base current Ibdc1 of the NPN bipolar transistor 11 that forms the current mirror decreases by ΔIbdc1, there is the following relation on the variations of these currents.

ΔIb=ΔIedc2+ΔIbdc1

Next, a variation ΔIcdc1 of the base current Icdc1 of the NPN bipolar transistor 11 that forms the current mirror is given as follows.

ΔIcdc1=−β*ΔIbdc1

Here, assuming that the reference current Iref is almost constant, a variation ΔIbdc2 of the base current Ibdc2 of the NPN bipolar transistor 12 for the base current compensation is given as follows.

ΔIbdc2=−ΔIcdc1=β*ΔIbdc1

Therefore, the variation ΔIedc2 of the emitter current Iedc2 of the NPN bipolar transistor 12 for the base current compensation is given as follows.

ΔIedc2=(1+β)*ΔIbdc2=β*(1+β)*ΔIbdc1

Therefore,

ΔIb=ΔIedc2+ΔIbdc1=ΔIbdc1*{1+β*(1+β)}=ΔIbdc1*(1+β+β²)

Therefore, ΔIbdc1 is given as follows.

$$\Delta Ibdc1 = \frac{\Delta Ib}{1+\beta+\beta^2}$$

The voltage drop at this moment of the NPN bipolar transistor 11 that forms the current mirror, namely the voltage drop ΔVb of the output voltage Vb is given as follows.

$$\Delta Vb = \frac{q}{nkT}\ln\left(1 - \frac{\Delta Ib}{Is \cdot (1+\beta+\beta^2) \cdot e^{\frac{qVb}{nkT}}}\right) < 0$$

Where n is the compensation coefficient, k is the Boltzmann's constant, T is the absolute temperature, q the electric charge, and Is the saturation current.

Accordingly, in the high frequency amplifier of the conventional technique, when the high frequency input signal Pin increases and generates the base rectified current ΔIb, the base voltage Vb generates the voltage drop of ΔVb; and as a result, the biasing class of the high frequency amplifier 1 approaches the B-class when the high frequency input signal Pin increases, which leads to a problem that the saturation output power and the efficiency are decreased.

The present invention has been made in order to solve the foregoing problem, and an object of the present invention is to achieve a high frequency amplifier that maintains a high efficiency, even if the high frequency input signal increases and generates the base rectified current.

Disclosure of Invention

The high frequency amplifying device according to this invention is provided, between a first and second resistors and a third NPN bipolar transistor, with a first and second PNP bipolar transistors forming a current mirror that uses a collector current of the third NPN bipolar transistor as a reference current, and determines a collector current of a second NPN bipolar transistor.

With this configuration, designing a size ratio of the first and second PNP bipolar transistors forming the current mirror so as to approximate a voltage drop to just zero, or a value infinitely close to zero will suppress the voltage drop of the base voltage, when the high frequency input signal increases and generates a base rectified current, which effects a high power output and high efficiency.

Further, varying the size ratio of the first and second PNP bipolar transistors forming the current mirror will adjust, i.e., increase, regularize, or decrease the base voltage, when the high frequency in put signal increases and generates the base rectified current, thus effecting a function to adjust the base voltage.

The high frequency amplifying device according to this invention is provided, between a first and second resistors and a third NPN bipolar transistor, with a first and second PMOS transistors forming a current mirror that uses a collector current of the third NPN bipolar transistor as a reference current, and determines a collector current of a second NPN bipolar transistor.

With this configuration, designing a size ratio of the first and second PMOS transistors forming the current mirror so as to approximate a voltage drop to just zero, or a value infinitely close to zero will suppress the voltage drop of the base voltage, when the high frequency input signal increases and generates a bases rectified current, which effects a high power output and high efficiency.

Further, varying the size ratio of the first and second PMOS transistors forming the current mirror will adjust, i.e., increase, regularize, or decrease the base voltage, when the high frequency input signal increases and generates the base rectified current, thus effecting a function to adjust the base voltage.

BEST MODE FOR CARRYING OUT THE INVENTION

In order to explain the present invention more in detail, the best mode for carrying out the present invention will be described with reference to the accompanying drawings.

EMBODIMENT 1

Figure 1:
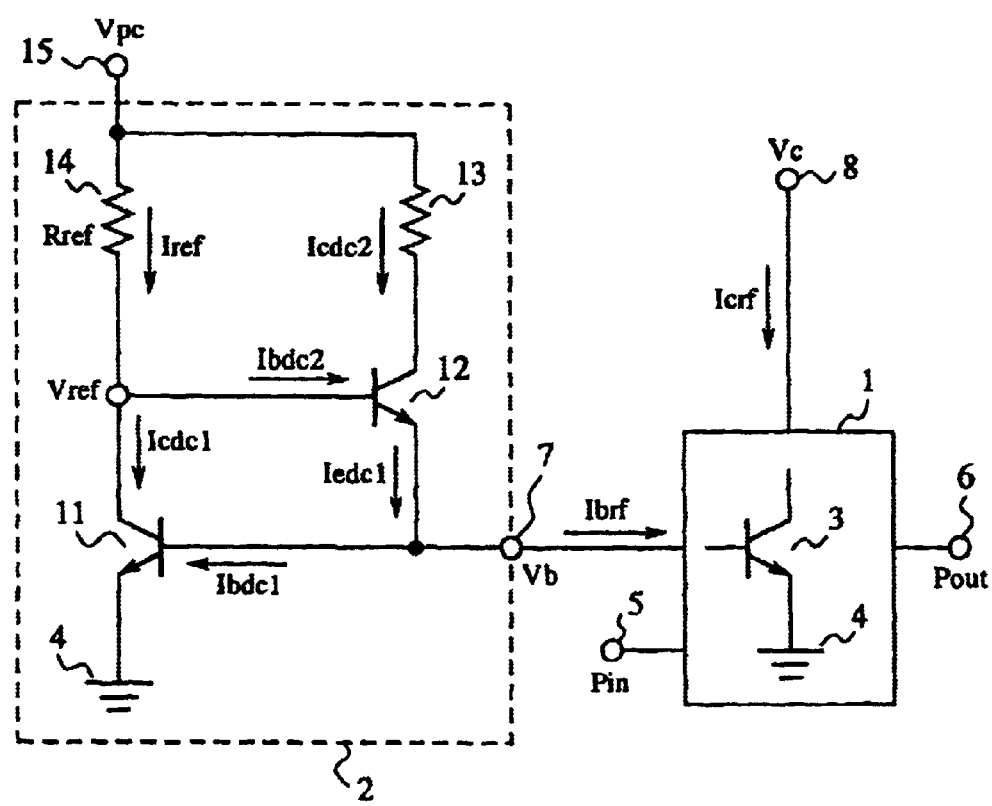
FIG. 1 is a circuit diagram illustrating a conventional high frequency amplifying device.
Figure 2:
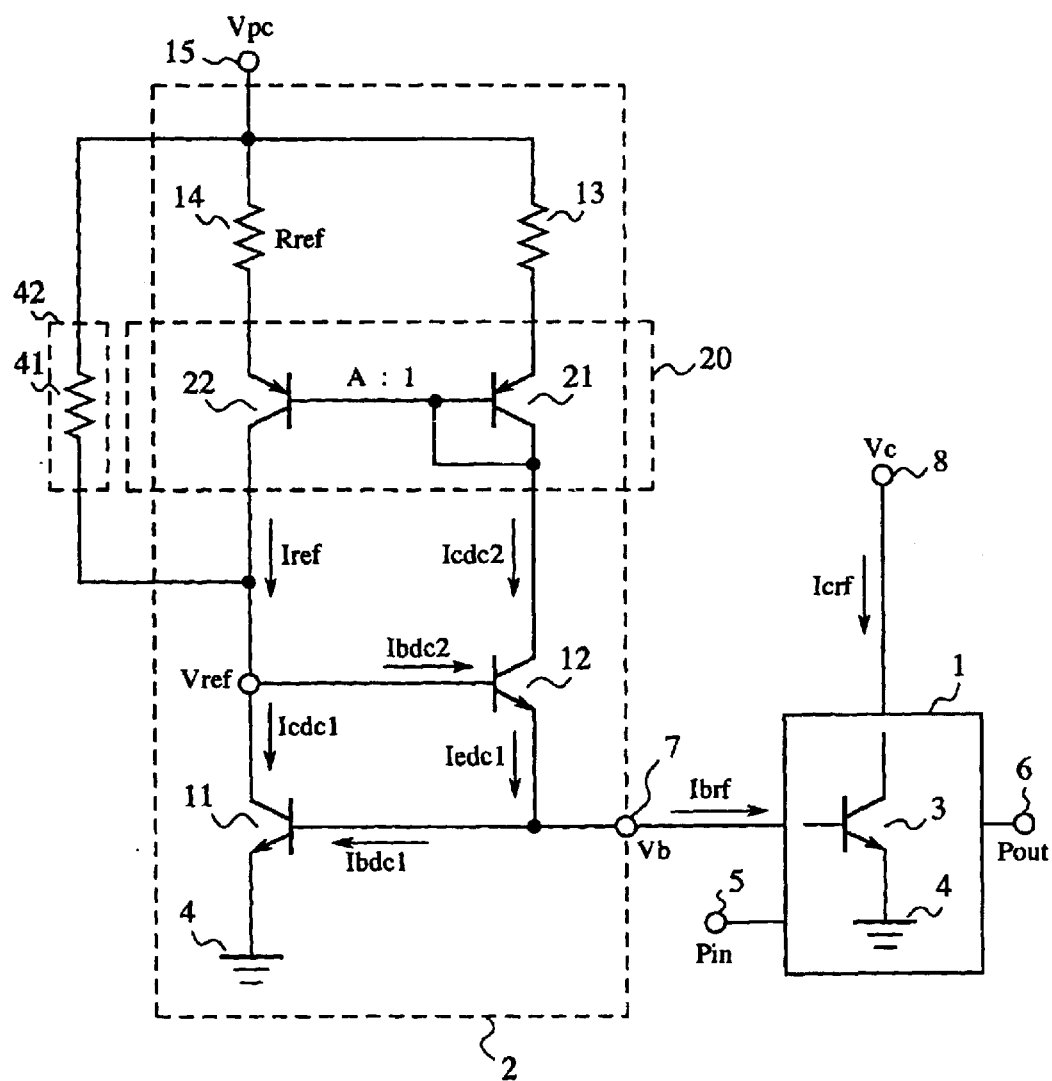
FIG. 2 is a circuit diagram illustrating a high frequency amplifying device according to an embodiment 1 of the present invention.

FIG. 2 is a circuit diagram illustrating a high frequency amplifying device according to an embodiment 1 of the present invention, and in the figure, reference numeral 1 signifies a high frequency amplifier using an NPN bipolar transistor such as the BJT, HBT, or the like, as an amplifying element, and 2 signifies a constant voltage biasing circuit that supplies a base bias voltage to the high frequency amplifier 1.

In the high frequency amplifier 1, reference numeral 3 signifies an NPN bipolar transistor (a first NPN bipolar transistor) such as the BJT, HBT, or the like, 4 a ground connected to the emitter terminal of the NPN bipolar transistor 3, 5 a high frequency signal input terminal, 6 a high frequency signal output terminal, 7 a base bias terminal, 8 a collector bias terminal.

In the constant voltage biasing circuit 2, reference numeral 11 signifies an NPN bipolar transistor (a second NPN bipolar transistor) such as the BJT, HBT, or the like, which configures a current mirror circuit together with the NPN bipolar transistor 3 of the high frequency amplifier 1, whose base terminal is connected to the base bias terminal 7, whose emitter terminal is connected to the ground 4. Reference numeral 12 signifies an NPN bipolar transistor (a third NPN bipolar transistor) such as the BJT, HBT, or the like, for a base current compensation, whose base terminal is connected to a collector terminal of the NPN bipolar transistor 11, whose emitter terminal is connected to a base terminal of the NPN bipolar transistor 11.

Further, reference numeral 20 signifies a current mirror that uses a collector current of the NPN bipolar transistor 12 as a reference current, and determines the collector current of the NPN bipolar transistor 11, 21, 22 signify PNP bipolar transistors (first and second PNP bipolar transistors) such as the BJT, HBT, or the like, which constitute the current mirror. In the current mirror, the bases of the PNP bipolar transistors 21, 22 are connected each other, the base and collector terminals of the PNP bipolar transistor 21 are commonly connected to the collector terminal of the NPN bipolar transistor 12, and the collector terminal of the PNP bipolar transistor 22 is connected to the base terminal of the NPN bipolar transistor 12.

Reference numeral 13 signifies a resistor (a first resistor) connected between the emitter terminal of the PNP bipolar transistor 21 and a power supply/voltage setting terminal 15, 14 a resistor (a second resistor) connected between the emitter terminal of the PNP bipolar transistor 22 and the power supply/voltage setting terminal 15, 41 a resistor connected between the collector terminal of the PNP bipolar transistor 22 and the power supply/voltage setting terminal 15, and 42 a start-up circuit composed of the resistor 41.

Next, the operation will be described.

A high frequency signal Pin is inputted to the high frequency amplifier 1 through the high frequency signal input terminal 5, and is output from the high frequency signal output terminal 6 after being amplified by the high frequency amplifier 1. A base voltage Vb and a base current Ibrf are supplied from the constant voltage biasing circuit 2, and a collector current Icrf and a collector voltage Vc are supplied from the collector bias terminal 8.

In the constant voltage biasing circuit 2, the base voltage Vb and the base current Ibrf are determined as follows. Herein, it is supposed that the size of the NPN bipolar transistor 11 that forms the current mirror together with NPN bipolar transistor 3 of the high frequency amplifier 1 is 1, the size of the NPN bipolar transistor 3 of the high frequency amplifier 1 is N, and the size of the NPN bipolar transistor 12 for the base current compensation is M. Also, it is supposed that these three NPN bipolar transistors 3, 11, 12 have the same structure and the same current amplification factor $\beta$. Further, it is supposed that a size ratio of the PNP bipolar transistors 21, 22 that form the current mirror 20 is 1:A as shown in FIG. 2, and the current amplifying factor is $\beta 2$. Further, the contact voltage Vref, the currents Iref, Icdc1, Ibdc1, Icdc2, Iedc2, Ibdc2, Ibrf, Icrf, and the resistor Rref are defined as shown in FIG. 2.

When a power supply voltage Vpc is supplied from the power supply/voltage setting terminal 15 of the constant voltage biasing circuit 2, the reference current Iref of the current mirror composed of the NPN bipolar transistors 3, 11 is given by the following expression, provided that the voltage across the base and emitter of the PNP bipolar transistor 22 is Vbpnp, Iref=(Vpc−2*Vb−Vbpnp)/Rref With regard to this reference current Iref, the collector current Icrf of the NPN bipolar transistor 3 of the high frequency amplifier 1 is given as follows.

$$Icrf = \frac{N}{1+\frac{1+N}{\beta\cdot(1+\beta)}} Iref$$

Where the base bias voltage Vb of the NPN bipolar transistor 3 of the high frequency amplifier 1 is set as follows.

Vb=(Vpc−Iref*Rref−Vbpnp)/2

The base current Ibrf flowing in this case becomes as follows.

Ibrf=Icrf/$\beta$

In this manner, the constant voltage biasing circuit 2 supplies the base voltage Vb and the base current Ib as the output thereof. Incidentally, the power supply/voltage setting terminal 15 supplies a start-up voltage to the connecting point of the collector terminal of the NPN bipolar transistor 11 and the collector terminal of the PNP bipolar transistor 22 by way of the start-up circuit 42 composed of the resistor 41, and thereby the constant voltage biasing circuit 2 is started.

In FIG. 2, a case will be examined, in which the input power of the high frequency amplifier 1 increases and generates the base rectified current of $\Delta$Ib, and consequently the constant voltage biasing circuit 2 increases the output of the base current Ibrf by $\Delta$Ib. When the base current Ibrf increases by $\Delta$Ib, the variations of these currents have the following relations.

$\Delta$Ib=$\Delta$Iedc2+$\Delta$Ibdc1

$\Delta$Iedc2=(1+$\beta$)*$\Delta$Ibdc2

$\Delta$Icdc2=$\beta$*$\Delta$Ibdc2

$\Delta$Icdc1=−$\beta$*$\Delta$Ibdc1

$$\Delta Iref = \frac{A\cdot\beta 2}{\beta 2+2}\Delta Icdc2$$

$\Delta$Ibdc2=$\Delta$Iref−$\Delta$Icdc1

Accordingly, $$\Delta Ibdc2 = \Delta Iref - \Delta Icdc1$$
$$= \frac{A\cdot\beta 2}{\beta 2+2}\Delta Icdc2 + \beta\cdot\Delta Ibdc1$$
$$= \frac{A\cdot\beta 2\cdot\beta}{\beta 2+2}\Delta Ibdc2 + \beta\cdot\Delta Ibdc1$$

$$\left(1 - \frac{A\cdot\beta 2\cdot\beta}{\beta 2+2}\right)\cdot\Delta Ibdc2 = \beta\cdot\Delta Ibdc1$$

Therefore, $$\Delta Ibdc2 = \frac{\beta}{1 - \frac{A \cdot \beta 2 \cdot \beta}{\beta 2 + 2}} \Delta Ibdc1$$

On the other hand, $$\Delta Ib = \Delta Iedc2 + \Delta Ibdc1$$

$$= \Delta Ibdc1 + (1 + \beta) * \Delta Ibdc2$$

$$= \Delta Ibdc1 + \frac{\beta \cdot (\beta + 1)}{1 - \frac{A \cdot \beta 2 \cdot \beta}{\beta 2 + 2}} \Delta Ibdc1$$

$$= \left[1 + \frac{\beta \cdot (\beta + 1)}{1 - \frac{A \cdot \beta 2 \cdot \beta}{\beta 2 + 2}}\right] \cdot \Delta Ibdc1$$

$$\Delta Ibdc1 = \frac{1}{1 + \frac{\beta \cdot (\beta + 1)}{1 - \frac{A \cdot \beta 2 \cdot \beta}{\beta 2 + 2}}} \Delta Ib$$

$$= \frac{1 - \frac{A \cdot \beta 2 \cdot \beta}{\beta 2 + 2}}{1 - \frac{A \cdot \beta 2 \cdot \beta}{\beta 2 + 2} + \beta \cdot (\beta + 1)} \Delta Ib$$

$$= \frac{\beta 2 + 2 - A \cdot \beta 2 \cdot \beta}{\beta 2 + 2 - A \cdot \beta 2 \cdot \beta + \beta \cdot (\beta + 1) \cdot (\beta 2 + 2)} \Delta Ib$$

The voltage drop at this moment of the NPN bipolar transistor 11 that forms the current mirror, namely the voltage drop ΔVb of the output voltage Vb is given as follows.

$$\Delta Vb = \frac{q}{nkT} \ln\left(1 - \frac{(\beta 2 + 2 - A \cdot \beta 2 \cdot \beta) \cdot \Delta Ib}{Is \cdot \{\beta 2 + 2 - A \cdot \beta 2 \cdot \beta + \beta \cdot (\beta + 1) \cdot (\beta 2 + 2)\} \cdot e^{\frac{qVb}{nkT}}}\right)$$

Where n is the compensation coefficient, k is the Boltzmann's constant, T is the absolute temperature, q the electric charge, and Is the saturation current.

Therefore, since β2+2<A*β2*β is generally satisfied, ΔVb>0 is deduced.

As described above, in the high frequency amplifying device according to the embodiment 1 of the present invention, when the high frequency input signal Pin increases and generates the base rectified current ΔIb, the base voltage Vb increases the voltage by ΔVb. As the result, the biasing class of the high frequency amplifier 1 approaches the A-class when the high frequency input signal Pin increases, which makes it possible to increase the saturation output power and the efficiency.

There is a common practice that interposes a resistor for isolation between the base bias terminal 7 of the high frequency amplifier 1 and the constant voltage biasing circuit 2 in FIG. 2. In that case, when the high frequency input signal Pin increases and generates the base rectified current ΔIb, depending on the value of the interposed resistor, it will be possible to increase, regularize, or decrease the base voltage Vb. Further, an adjustment of the size ratio A of the PNP bipolar transistors 21, 22 that form the current mirror 20 will make it possible to adjust, i.e., increase, regularize, or decrease the base voltage Vb, when the high frequency input signal Pin increases and generates the base rectified current ΔIb.

However, when the high frequency input signal Pin increases and generates the base rectified current ΔIb, and the base voltage Vb increases by ΔVb, increase of the base voltage Vb will further increase the base current Ib that flows through the high frequency amplifier 1, and thereby the base voltage Vb will further increase; and this repetition will make the circuit operation divergent. Therefore, it will be important to design the generally interposed isolation resistor between the base bias terminal 7 and the constant voltage biasing circuit 2 and the size ratio A of the PNP bipolar transistors 21, 22 that form the current mirror 20 in such a manner that the voltage drop ΔVb becomes just zero, or a value infinitely close to zero; and thereby, even when the high frequency input signal Pin increases and generates the base rectified current ΔIb, the voltage drop of the base voltage Vb can be suppressed, and in consequence the high power output and high efficiency can be achieved.

EMBODIMENT 2

Figure 3:
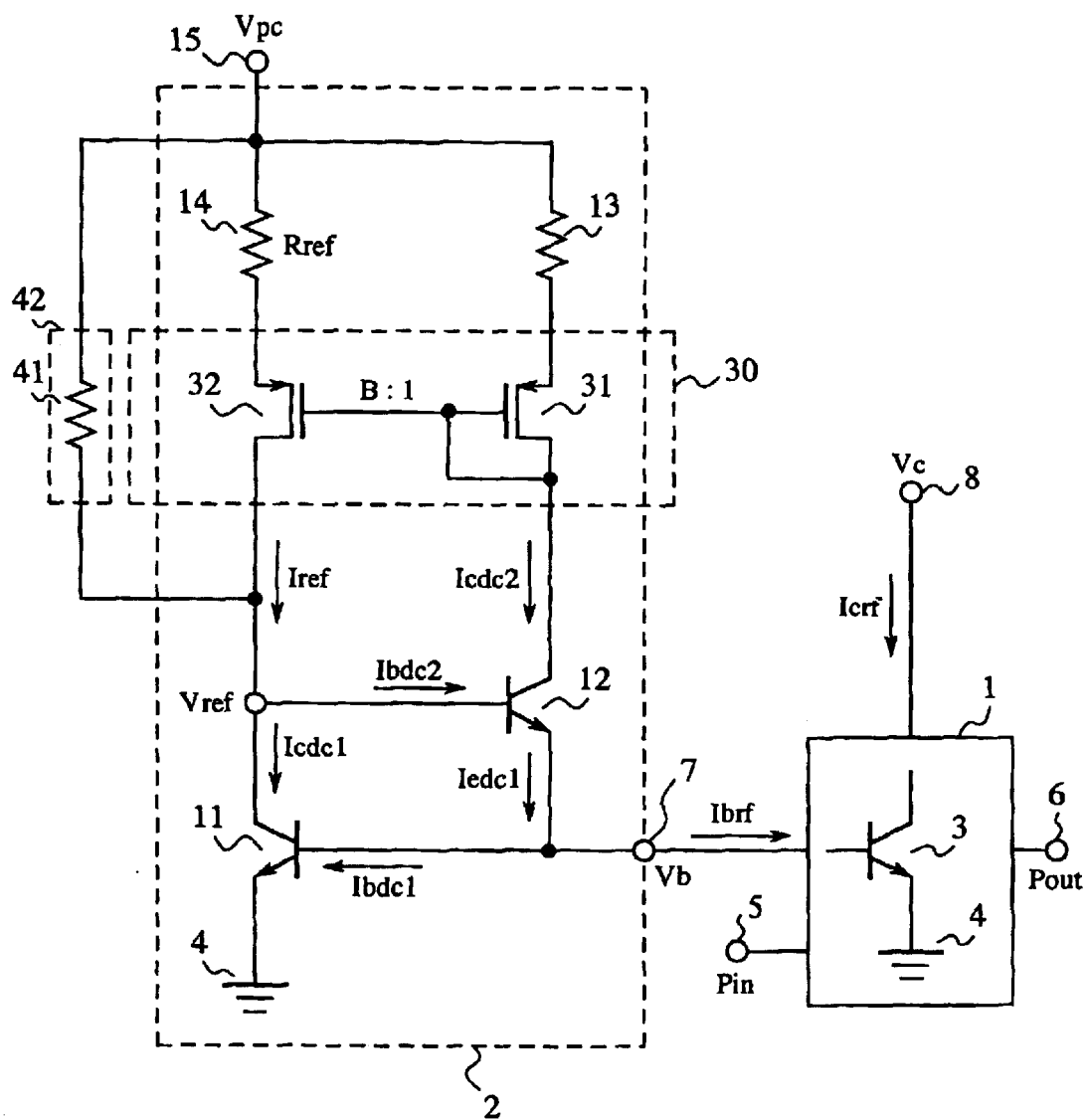
FIG. 3 is a circuit diagram illustrating a high frequency amplifying device according to an embodiment 2 of the present invention.

FIG. 3 is a circuit diagram illustrating a high frequency amplifying device according to the embodiment 2 of the present invention, and in the figure, reference numeral 30 signifies a current mirror that uses the collector current of an NPN bipolar transistor 12 as the reference current, and determines the collector current of an NPN bipolar transistor 11, and 31, 32 signify PMOS transistors (first and second PMOS transistors) that constitute the current mirror. In the current mirror, the gates of the PMOS transistors 31, 32 are connected to each other, the gate and drain terminals of the PMOS transistor 31 are commonly connected to the collector terminal of the NPN bipolar transistor 12, and the drain terminal of the PMOS transistor 32 is connected to the base terminal of the NPN bipolar transistor 12.

Further, the resistor (first resistor) 13 is connected between the source terminal of the PMOS transistor 31 and the power supply/voltage, setting terminal 15, the resistor (second resistor) 14 is connected between the source terminal of the PMOS transistor 32 and the power supply/voltage setting terminal 15, and a resistor 41 is connected between the drain terminal of the PMOS transistor 32 and the power supply/voltage setting terminal 15. In addition, a start-up circuit 42 composed of the resistor 41.

Next, the operation will be described.

The high frequency signal Pin is input to the high frequency amplifier 1 through the high frequency signal input terminal 5, and is output from the high frequency signal output terminal 6, after being amplified by the high frequency amplifier 1. The base voltage Vb and the base current Ibrf are supplied from a constant voltage biasing circuit 2, and the collector current Icrf and the collector voltage Vc are supplied from a collector bias terminal 8.

In the constant voltage biasing circuit 2, the base voltage Vb and the base current Ibrf are determined as follows. Herein it is supposed that the size of the NPN bipolar transistor 11 that forms the current mirror together with the high frequency amplifier 1 is 1, the size of the NPN bipolar transistor 3 of the high frequency amplifier 1 is N, and the size of the NPN bipolar transistor 12 for the base current compensation is M. Also, it is supposed that these three NPN bipolar transistors 3, 11, 12 have the same structure and the same current amplification factor β. Further, the size ratio of the PMOS transistors 31, 32 that form the current mirror 30 is supposed to be 1:B as shown in FIG. 3. Further, the contact voltage Vref, the currents Iref, Icdc1, Ibdc1, Icdc2, Iedc2, Ibdc2, Ibrf, Icrf, and the resistor Rref are defined as shown in FIG. 3.

When the power supply voltage Vpc is supplied from the power supply/voltage setting terminal 15 of the constant voltage biasing circuit 2, the reference current Iref of the current mirror composed of the NPN bipolar transistors 3, 11 is given by the following expression, provided that the voltage across the gate and source of the PMOS transistor 32 is Vgs, Iref=(Vpc−2*Vb−Vgs)/Rref With regard to this reference current Iref, the collector current Icrf of the NPN bipolar transistor 3 of the high frequency amplifier 1 is given as follows.

$$Icrf = \frac{N}{1 + \frac{1+N}{\beta \cdot (1+\beta)}} Iref$$

In this case, the base bias voltage Vb of the NPN bipolar transistor 3 of the high frequency amplifier 1 is set as follows.

Vb=(Vpc−Iref*Rref−Vgs)/2

The base current Ibrf flowing in this case becomes as follows.

Ibrf=Icrf/β

In this manner, the constant voltage biasing circuit 2 supplies the base voltage Vb and the base current Ib as the output thereof. Incidentally, the power supply/voltage setting terminal 15 supplies a start-up voltage to the connecting point of the collector terminal of the NPN bipolar transistor 11 and the drain terminal of the PMOS transistor 32 by way of the start-up circuit 42 composed of the resistor 41, and thereby the constant voltage biasing circuit 2 is started.

In FIG. 3, a case will be examined, in which the input power of the high frequency amplifier 1 increases and generates the base rectified current of ΔIb, and consequently the constant voltage biasing circuit 2 increases the output of the base current Ibrf by ΔIb. When the base current Ibrf increases by ΔIb, the variations of these currents have the following relations.

ΔIb=ΔIedc2+ΔIbdc1

ΔIedc2=(1+β)*ΔIbdc2

ΔIcdc2=β*ΔIbdc2

ΔIcdc1=−β*ΔIbdc1

ΔIref=B*ΔIcdc2

ΔIbdc2=ΔIref−ΔIcdc1

Therefore,

ΔIbdc2=ΔIref−ΔIcdc1=B*ΔIcdc2+β*ΔIbdc1

(1−B)*ΔIbdc2=β*ΔIbdc1

Accordingly, $$\Delta Ibdc2 = \frac{\beta}{1-B}\Delta Ibdc1$$

On the other hand, $$\Delta Ib = \Delta Iedc2 + \Delta Ibdc1$$
$$= \Delta Ibdc1 + (1+\beta)*\Delta Ibdc2$$
$$= \Delta Ibdc1 + \frac{\beta \cdot (\beta+1)}{1-B}\Delta Ibdc1$$
$$= \left[1 + \frac{\beta \cdot (\beta+1)}{1-B}\right] \cdot \Delta Ibdc1$$

Accordingly, $$\Delta Ibdc1 = \frac{1}{1 + \frac{\beta \cdot (\beta+1)}{1-B}}\Delta Ib$$
$$= \frac{1-B}{1-B+\beta \cdot (\beta+1)}\Delta Ib$$
$$= \frac{1-B}{B^2+\beta-B+2}\Delta Ib$$

The voltage drop at this moment of the NPN bipolar transistor 11 that forms the current mirror, namely the voltage drop ΔVb of the output voltage Vb is given as follows.

$$\Delta Vb = \frac{q}{nkT}\ln\left(1 - \frac{(1-B)\cdot \Delta Ib}{Is \cdot (\beta^2 + \beta - B + 2) \cdot e^{\frac{qVb}{nkT}}}\right)$$

Therefore, if the relation B>1 is met, ΔVb>0 is deduced; if B=1, ΔVb=0; and if B<1, ΔVb<1.

As described above, in the high frequency amplifying device according to the embodiment 2 of the present invention, setting the size ratio of the PMOS transistors 31, 32 that form the current mirror 30 into B>1 will make it possible to raise the base voltage Vb by ΔVb, when the high frequency input signal Pin increases and generates the base rectified current ΔIb. As a result, the biasing class of the high frequency amplifier 1 approaches the A-class when the high frequency input signal Pin increases, which will increase the saturation output power and the efficiency.

Further, setting the size ratio of the PMOS transistors 31, 32 that form the current mirror 30 into B=1 will make it possible to zero the voltage drop of the base voltage Vb, when the high frequency input signal Pin increases and generates the base rectified current ΔIb. As a result, the biasing class of the high frequency amplifier 1 can be stabilized, when the high frequency input signal Pin increases, which will increase the saturation output power and the efficiency.

In this manner, only a change of the size ratio B of the PMOS transistors 31, 32 that form the current mirror 30 will adjust, i.e., increase, regularize, or decrease the base voltage Vb, when the high frequency input signal Pin increases and generates the base rectified current ΔIb.

There is a common practice that interposes a resistor for isolation between the base bias terminal 7 of the high frequency amplifier 1 and the constant voltage biasing circuit 2 in FIG. 3. In that case, increasing the size ratio B of the PMOS transistors 31, 32 that form the current mirror 30 for a compensation of the voltage drop by the resistor will realize all the characteristics mentioned above.

However, when the high frequency input signal Pin increases and generates the base rectified current ΔIb, and the base voltage Vb increases by ΔVb, the increase of the base voltage Vb will further increase the base current Ib that flows through the high frequency amplifier 1, and thereby the base voltage Vb will further increase; and this repetition will make the circuit operation divergent.

Therefore, it will be important to design the generally interposed isolation resistor between the base bias terminal 7 and the constant voltage biasing circuit 2 and the size ratio B of the PMOS transistors 31, 32 that form the current mirror 30 in such a manner that the voltage drop $\Delta Vb$ becomes just zero, or a value infinitely close to zero; and thereby, even when the high frequency input signal Pin increases and generates the base rectified current $\Delta Ib$, the voltage drop of the base voltage Vb can be suppressed, and in consequence the high power output and high efficiency can be achieved.

Industrial Applicability

As being described above, the high frequency amplifying device according to the present invention is able to regularize the base voltage by adjusting the size ratio of the transistors that form the current mirror, when the high frequency input signal increases and generates the base rectified current, which is suitable for use in a satellite communication, ground microwave communication, and mobile communication, and the like.

What is claimed is:

1. A high frequency amplifying device comprising:
   a high frequency amplifier that uses a first NPN bipolar transistor as an amplifying element, the collector terminal of said first NPN bipolar transistor being operatively connected to a collector bias terminal; and
   a constant voltage biasing circuit that supplies a base bias voltage to said high frequency amplifier;
   wherein said constant voltage biasing circuit includes:
      a second NPN bipolar transistor that forms a current mirror together with said first NPN bipolar transistor;
      a third NPN bipolar transistor that compensates a base current of said current mirror;
      a first and second PNP bipolar transistors forming a current mirror that uses a collector current of said third NPN bipolar transistor as a reference current, and determines a collector current of said second NPN bipolar transistor; and
      a first and second resistors that are operatively connected between the emitter terminals of said first and second PNP bipolar transistors and a power supply/voltage setting terminal.

2. A high frequency amplifying device comprising:
   a high frequency amplifier that uses a first NPN bipolar transistor as an amplifying element; and
   a constant voltage biasing circuit that supplies a base bias voltage to said high frequency amplifier;
   wherein said constant voltage biasing circuit includes:
      a second NPN bipolar transistor that forms a current mirror together with said first NPN bipolar transistor;
      a third NPN bipolar transistor that compensates a base current of said current mirror;
      a first and second PMOS transistors forming a current mirror that uses a collector current of said third NPN bipolar transistor as a reference current, and determines a collector current of said second NPN bipolar transistor; and
      a first and second resistors that are interposed between source terminals of said first and second PMOS, transistors and a power supply/voltage setting terminal.

* * * * *